United States Patent
Galyon et al.

(10) Patent No.: US 6,636,065 B2
(45) Date of Patent: Oct. 21, 2003

(54) SYSTEM AND METHOD FOR A DEVICE RELIABILITY AND TEST CIRCUIT

(75) Inventors: George T. Galyon, Fishkill, NY (US); King M. Chu, Wappingers Falls, NY (US); Jeffrey A. Newcomer, Beacon, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/896,590

(22) Filed: Jun. 29, 2001

(65) Prior Publication Data

US 2003/0001607 A1 Jan. 2, 2003

(51) Int. Cl.[7] ............................................... G01R 31/26
(52) U.S. Cl. .................................... 324/765; 324/158.1
(58) Field of Search ............................. 324/158.1, 765, 324/768, 769, 767, 760, 763; 371/21.1; 714/1–47

(56) References Cited

U.S. PATENT DOCUMENTS

| | | | |
|---|---|---|---|
| 3,553,571 A | | 1/1971 | Fendt et al. ................... 324/52 |
| 3,648,170 A | * | 3/1972 | Embree et al. ............. 324/769 |
| 3,889,188 A | | 6/1975 | Trindade ................ 324/158 T |
| 4,368,409 A | * | 1/1983 | Sivanesan et al. .......... 315/411 |
| 5,321,354 A | * | 6/1994 | Ooshima et al. ............ 324/765 |
| 5,467,026 A | | 11/1995 | Arnold ......................... 326/16 |
| 5,872,460 A | | 2/1999 | Bennett et al. ............. 324/769 |
| 5,959,309 A | | 9/1999 | Tsui et al. ..................... 257/48 |
| 6,072,317 A | * | 6/2000 | Mackenzie .................. 324/508 |
| 6,097,064 A | * | 8/2000 | Saitoh et al. ............... 257/345 |
| 6,150,831 A | * | 11/2000 | Asai et al. .................. 324/763 |

* cited by examiner

*Primary Examiner*—Kamand Cuneo
*Assistant Examiner*—Tung X. Nguyen
(74) *Attorney, Agent, or Firm*—Floyd A. Gonzalez; Cantor Colburn LLP

(57) ABSTRACT

An exemplary embodiment is a system and method for a device reliability test circuit. The method includes applying a DC voltage across the device for a period, wherein the DC voltage is less than the rated voltage of said device, and determining a failure point of the device based on applying the DC voltage.

21 Claims, 3 Drawing Sheets

SYSTEM AND METHOD FOR A DEVICE RELIABILITY AND TEST CIRCUIT

BACKGROUND

The invention relates generally to reliability testing, and more specifically, to a system and method for a device reliability and test circuit.

Semiconductor devices exhibit high reliability since the electronic functions thereof are primarily performed within a solid, and this solid can be expected to retain its initial properties indefinitely, if it is not subjected to conditions beyond its limits. Semiconductor devices are being required to meet reliability levels far in excess of older types of electronic devices. Failure in semiconductor devices, such as field effect transistors, that are observed over a period of time, are principally caused by the sensitivity of these devices to slight imperfections or variations in the manufacturing processes in which submicroscopic effects play so vital a role. These imperfections are so slight that they cannot be detected by the most precise production inspection and show up only as changes in the characteristics of the device over an extended period of time. Therefore it is desirable, and in some instances, necessary, not only to test semiconductor devices for initial satisfactory operating characteristics, but to test them to determine or predict the span of the reliable operating life.

To improve the reliability of semiconductor devices, it is necessary to be able to measure reliability itself with reasonable accuracy. In many past applications, the failure rates of semiconductor devices were so low that it was impossible to measure actual failure rates under normal operating conditions. The semiconductor industry has often turned to stress acceleration testing in order to shorten the time to failure, hopefully, without introducing new failure mechanisms. Most stress, or accelerated, testing techniques known in the art rely on increases in operating temperature/voltage/current to produce failures at an earlier point in time because it is believed that increases in temperature normally will not introduce any failure mechanisms which would not be present under normal operating conditions.

Unfortunately, in the manufacture of semiconductor devices, particularly field effect transistors, not only are many failure modes present, but insufficient data exists to determine the form taken by the failure acceleration curve. Further, attempts to determine reliability of semiconductor devices are typically concerned with determining failure modes early in a failure period. Regrettably, the results of such attempts may be inconclusive for time dependent failure mechanisms. Thus, time dependent failures may be an unexpected source of costly problems.

SUMMARY

An exemplary embodiment is a system and method for a device reliability test circuit. The method includes applying a DC voltage across the device for a period, wherein the DC voltage is less than the rated voltage of said device, and determining a failure point of the device based on applying the DC voltage.

BRIEF DESCRIPTION OF THE DRAWINGS

Referring to the exemplary drawings wherein like elements are numbered alike in the several Figures.

DETAILED DESCRIPTION

The system and method described herein may be used to aid in the proper selection of a device for a certain application and/or aid in determining the reliability of the device for the application. As is well known, electrical and electronic devices have recommended operating parameters. For example, for devices such as semiconductors, capacitors and insulators, an operating parameter such as a rated voltage is specified. A device may be selected for a particular application based on a factor such as its rated voltage. However, in applications applying a DC voltage less than the rated voltage, failures may occur as the applied voltage approaches the rated voltage. Note that the root cause(s) of such failures are not currently known. However, a possibility may be that of a single even burnout (SEB) type of event in which radiation generates electron-hole pair generation in the depletion region of the reversed bias junction, which triggers an avalanche phenomenon akin to secondary breakdown of the parsitic npn inhernet in every power MOSFET. Therefore, the rated voltage of a device may not be determinative of the device's use and/or reliability in certain applications.

Figure 1:
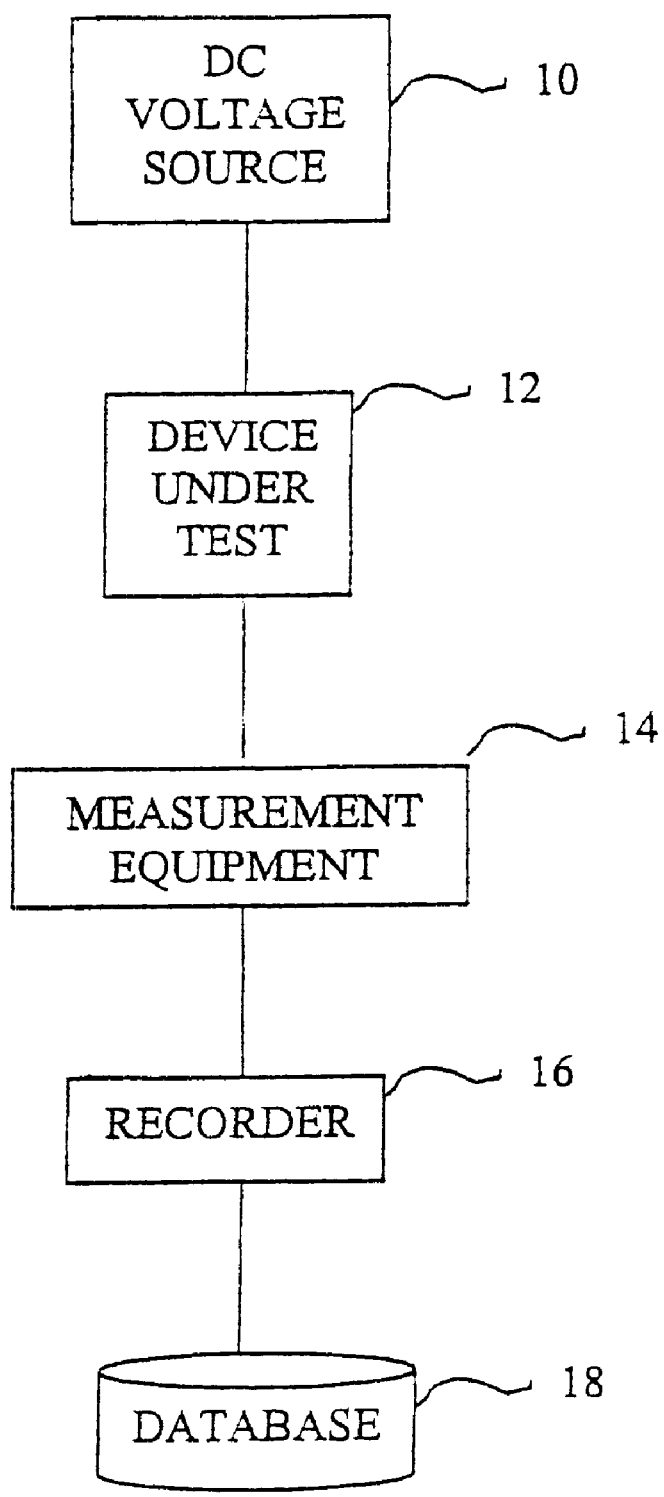
FIG. 1 is a block diagram of a system for a device reliability and test circuit in one embodiment.

Referring to FIG. 1, a system for a device reliability and test circuit in one embodiment will now be discussed. In general, in the embodiment of FIG. 1, a DC voltage below the device's rated voltage is applied for a period of time. As is well known, when a semiconductor device, such as a FET, begins to fail, it will begin to conduct a current (leakage current) between its source and drain terminals. Note that the system and method described herein may also be used for devices other than power MOSFETs. For example, capacitors, diodes, and bipolar transistors may be tested using the system and method. Also, note that the time period of the test may be open ended. For example, the test time period for a power MOSFET may range from about one day to about three weeks. However, in some cases, the testing may even be completed within hours. Basically, the time period is the amount of time for a particular device to fail at a DC voltage below the device's rated voltage.

In FIG. 1, a DC voltage source 10, such as a battery, power supply or the like is shown operatively connected to a device under test (DUT) 12. As previously mentioned, the DUT 12 may be any device where the leakage characteristics are desired to be determined at a voltage below the rated voltage. A measurement device 14, such as a current meter, voltage meter or the like is shown operatively connected to the DUT 12 for detecting a leakage current by measuring the current through the DUT 12. A recorder 16, that may include a printer and/or monitor or the like is shown operatively connected to the measurement device 14 for recording measured data. A database 18 may be included for storing the measured data.

Figure 2:
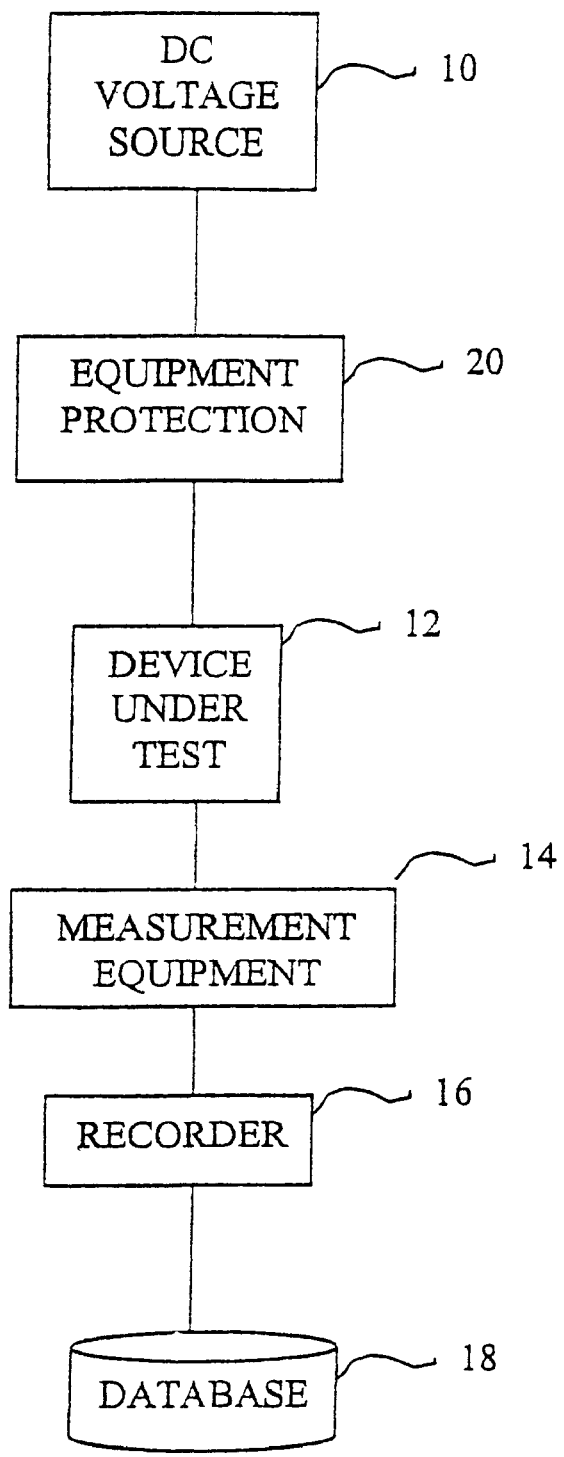
FIG. 2 is a block diagram of a system for a device reliability and test circuit in another embodiment.
Figure 3:
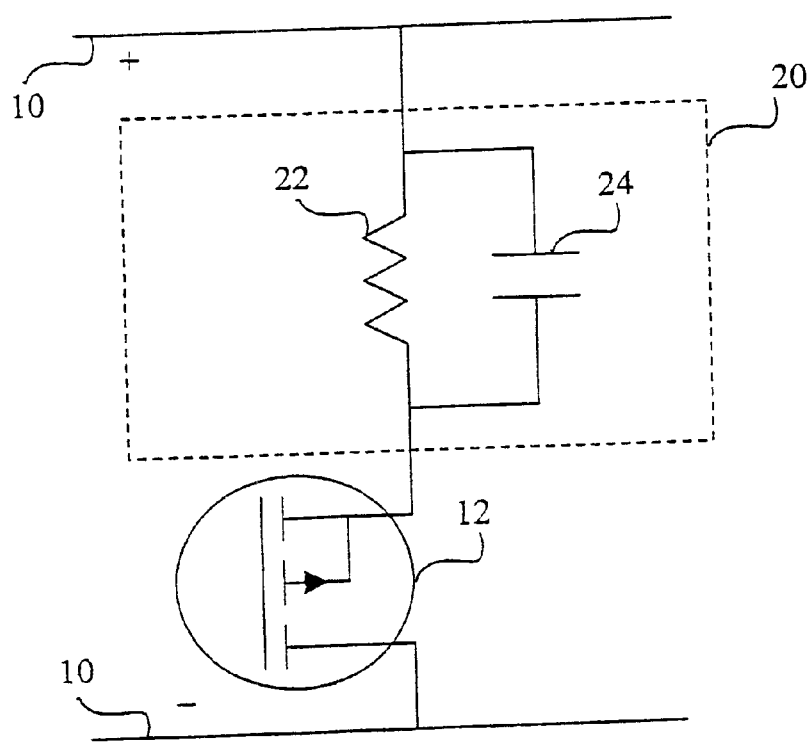
FIG. 3 is a schematic of an exemplary configuration for protecting the test equipment while maintaining a constant voltage across a device in one embodiment.

In the embodiment of FIG. 2, a means for protecting the test equipment (e.g., by limiting the current) may be included, hereafter referred to as equipment protection device 20. For example, FIG. 3 is a schematic of an exemplary configuration for protecting the DC voltage source, while maintaining a constant voltage across the DUT 12. As previously discussed, the embodiments described herein are not limited to a MOSFET device. The voltage is applied to the source and drain of the DUT 12 such that the onset of any leakage current does not result in a diminution of the applied voltage. This allows the voltage across the DUT 12 to remain constant even as the DUT 12 begins to fail. The equipment protection device 20 of FIG. 3 includes a current limiting resistor 22 operatively connected in series with the DUT 12. Basically, the current limiting resistor 22 is selected to ensure that the test equipment and/or DUT 12 is not damaged. Note that the current capability of the power supply used in the test setup determines what value the limiting resistor should be.

If used alone, the current limiting resistor 22 would act to modulate a failure (e.g., leakage current) by transferring voltage from the DUT 12 to the current limiting resistor 22 as the DUT 12 began to fail. The voltage across the DUT 12 would decrease as the leakage current increased, thereby slowing down and eventually halting the failure (e.g., stabilizing the leakage current). For example, a shorting of the DUT 12 would begin the process of transferring voltage from the DUT 12 to the limiting resistor. This transfer of voltage would effectively decrease the energy dissipated within the DUT 12. If the transfer of voltage happened quickly enough, the shorting event might not be catastrophic to the DUT 12. It is the combination of a short in the DUT 12, plus a sustained voltage that causes failure of the DUT 12.

Therefore, a capacitor 24 may be operatively connected in parallel with the current limiting resistor 22 to obviate the effect of the current limiting resistor 22. The capacitor is intended to "slow down" the rate of voltage transfer from the failing DUT 12 to the limiting resistor. Therefore, the capacitor may be relatively large (e.g., for a power MOSFET under test, the capacitor may be greater than about 2.5 $\mu f$). As a voltage is applied to the circuit, initially, all the applied voltage is across the DUT 12, but when the DUT 12 begins to fail (e.g., when the leakage current begins to increase), the capacitor 24 acts as a short and the applied voltage across the DUT 12 is kept constant (even as the leakage current increases). Note that other embodiments may include any circuit configuration that protects the equipment while maintaining a constant voltage across the DUT 12.

Figure 4:
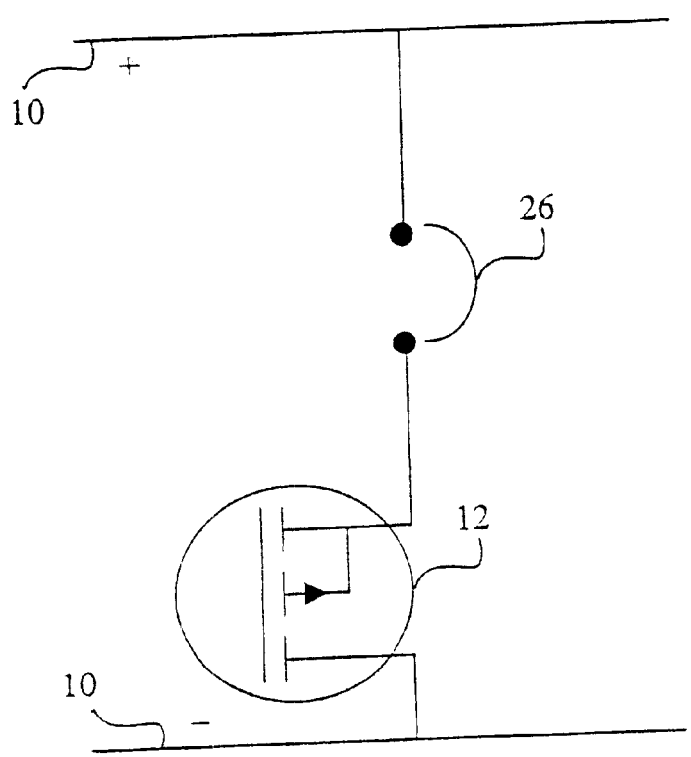
FIG. 4 is a schematic of an exemplary configuration for protecting the test equipment in one embodiment.

Another embodiment for protecting the test equipment is shown in FIG. 4. A circuit breaker 26 is operatively connected in series with the DUT 12. The circuit breaker 26 is selected to trip at a specified current rating. For example, an ultra fast circuit breaker may be used to quickly (e.g., within about 5 $\mu s$) "clamp" a current spike to a value effectively near zero such that the peak value of the spike is prevented from exceeding a maximum value. The circuit breaker will then turn off within a certain time after the clamping action. It is the <5 us clamping action which is the essential element of an ultra fast circuit breaker.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

What is claimed is:

1. A system for determining the reliability of a device, the system comprising:
   a DC voltage means for supplying a DC voltage across said device;
   wherein said DC voltage is less than the rated operating voltage of said device;
   a measurement means for measuring the current through said device;
   wherein said device is operatively connected to said DC voltage means and said measurement means;
   an equipment protection means for limiting damaging current at said device; and
   wherein said equipment protection means is operatively connected between said DC voltage means and said device.

2. The system of claim 1, wherein said equipment protection means maintains a constant DC voltage across said device.

3. The system of claim 2, wherein said equipment protection means includes a resistor operatively connected in parallel with a capacitor.

4. The system of claim 1, wherein said equipment protection means includes a circuit breaker.

5. The system of claim 1, further including:
   a recording means for recording data from said measurement means; and
   wherein said recording means is operatively connected to said measurement means.

6. The system of claim 5, wherein said recording means includes a database for storing said data from said measurement means.

7. The system of claim 1, wherein said device is a semiconductor.

8. The system of claim 7, wherein said semiconductor is a field effect transistor.

9. A system for determining the reliability of a device, the system comprising:
   a DC voltage means operatively connected to said device for supplying a DC voltage across said device;
   a measurement means operatively connected to said device for measuring current through said device;
   an equipment protection means operatively connected between said DC voltage means and said device for limit ng damaging current at said device; and
   wherein said DC voltage is less than the rated operating voltage of said device.

10. A system for determining the reliability of a device, the system comprising:
    a DC voltage means operatively connected to said device for supplying a DC voltage across said device;
    a measurement means operatively connected to said device for measuring the current through said device;
    an equipment protection means operatively connected between said DC voltage means and said device for limit ng damaging current at said device;
    wherein said DC voltage is less than the rated operating voltage of said device; and
    wherein said equipment protection means maintains a constant DC voltage across said device.

11. A system for determining the reliability of a device, the system comprising:
    a DC power supply operatively connected to said device;
    a current meter operatively connected to said device;

wherein said power supply voltage is less than the rated operating voltage of said device;

a resistor operatively connected in parallel with a capacitor;

wherein said resistor an said capacitor are operatively connected between said DC power supply and said device; and wherein said resistor an said capacitor are selected to maintain a constant DC voltage across said device.

12. The system of claim 11, further including a circuit breaker operatively connected between said DC power supply and said device; and wherein said circuit breaker is selected to trip at a specified current rating.

13. The system of claim 11, further including:

a recorder for recording data from said current meter; and wherein said recorder is operatively connected to said current meter.

14. The system of claim 13, wherein said recorder includes a database for storing said data from said current meter.

15. The system of claim 11, wherein said device is a semiconductor.

16. The system of claim 15, wherein said semiconductor is a field effect transistor.

17. A system for determining the reliability of a device, the system comprising:

a DC power supply operatively connected to said device;

a current meter operatively connected to said device;

wherein said DC power supply voltage is less than the rated operating voltage of said device;

a resistor operatively connected in parallel with a capacitor;

wherein said resistor an said capacitor are operatively connected between said DC power supply and said device; and wherein said resistor an said capacitor are selected to maintain a constant DC voltage across said device.

18. A method for determining the reliability of a device, the method comprising:

applying a DC voltage cross said device for a period;

wherein said DC voltage is less than the rated operating voltage of said device;

protecting test equipment from damaging current; and determining a failure point of said device based on said applying said DC voltage.

19. The method of claim 18, further including maintaining a constant DC voltage across said device.

20. A method for determining the reliability of a device, the method comprising:

applying a DC voltage across said device for a period;

determining a failure point of said device based on said applying said DC voltage;

protecting said device from damaging current; and wherein said DC voltage is less than the rated operating voltage of said device.

21. A method for determining the reliability of a device, the method comprising:

applying a DC voltage across said device for a period;

wherein said DC voltage is less than the rated operating voltage of said device;

measuring a current through said device;

protecting said device from damaging current; and determining whether said current affects said device reliability.

* * * * *